United States Patent
Pinol Pedret et al.

(10) Patent No.: US 9,226,412 B2
(45) Date of Patent: Dec. 29, 2015

(54) HOUSING WITH AIR CHAMBER FOR BATTERY MONITOR SYSTEM AND METHOD FOR MANUFACTURING SAME

(71) Applicant: Lear Corporation, Southfield, MI (US)

(72) Inventors: Montserrat Pinol Pedret, Valls (ES); Jose Antonio Cubero Pitel, Valls (ES); Miguel Saiz Garcia, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 14/325,731

(22) Filed: Jul. 8, 2014

(65) Prior Publication Data
US 2015/0083484 A1 Mar. 26, 2015

Related U.S. Application Data

(60) Provisional application No. 61/861,592, filed on Aug. 2, 2013.

(51) Int. Cl.
| | |
|---|---|
| *H05K 5/00* | (2006.01) |
| *H01M 10/48* | (2006.01) |
| *H01R 11/28* | (2006.01) |
| *G01R 31/36* | (2006.01) |
| *H01M 2/20* | (2006.01) |

(52) U.S. Cl.
CPC ............ *H05K 5/0004* (2013.01); *H01M 10/48* (2013.01); *G01R 31/3696* (2013.01); *H01M 2/20* (2013.01); *H01M 2250/20* (2013.01); *H01R 11/287* (2013.01)

(58) Field of Classification Search
CPC . H05K 5/0004; G01R 31/3696; H01R 11/287
USPC ................................................. 174/560–564
See application file for complete search history.

(56) References Cited

U.S. PATENT DOCUMENTS

| | | | | |
|---|---|---|---|---|
| 4,675,255 A * | 6/1987 | Pfeifer | ................. | G01R 15/202 324/117 H |
| 5,645,448 A * | 7/1997 | Hill | ....................... | H01H 85/203 439/522 |
| 5,689,089 A * | 11/1997 | Polak | ..................... | H01L 23/057 174/521 |
| 5,731,541 A * | 3/1998 | Bernd | ................... | B29C 31/045 174/358 |
| 6,218,805 B1 * | 4/2001 | Melcher | ............... | G01R 31/362 320/105 |
| 6,347,958 B1 * | 2/2002 | Tsai | ................... | G01R 31/3686 340/653 |
| 6,551,147 B2 * | 4/2003 | Wakata | ............. | G01R 31/3696 320/105 |
| 6,787,935 B2 * | 9/2004 | Heim | ..................... | G01R 1/203 307/10.1 |

(Continued)

FOREIGN PATENT DOCUMENTS

| | | |
|---|---|---|
| DE | 10333035 A1 | 2/2005 |
| DE | 102005034427 A1 | 1/2007 |

(Continued)

*Primary Examiner* — Hung V Ngo
(74) *Attorney, Agent, or Firm* — Brooks Kushman P.C.

(57) ABSTRACT

A housing is described that may include a main portion having at least one wall defining an opening that may have a perimeter. The at least one wall may have a rib and an inner wall extending therefrom about the perimeter of the opening. The inner wall may have an air relief slot formed therein. The housing may further include a cover. The cover may have an edge defining a perimeter. The cover may include a rib extending from the edge about the perimeter of the cover. The main portion rib, the inner wall and the cover rib may cooperate for attachment of the cover to the main portion and to define an air chamber between the cover rib and the inner wall.

14 Claims, 4 Drawing Sheets

(56) References Cited

U.S. PATENT DOCUMENTS

| | | | |
|---|---|---|---|
| 6,808,841 B2* | 10/2004 | Wakata | G01R 31/3696 |
| | | | 429/61 |
| 7,578,710 B2 | 8/2009 | Koelle et al. | |
| 7,615,987 B2 | 11/2009 | Koelle et al. | |
| 2005/0176282 A1* | 8/2005 | Hirthammer | H01R 11/281 |
| | | | 439/217 |
| 2006/0057899 A1* | 3/2006 | Tokunaga | H01M 10/48 |
| | | | 439/754 |
| 2008/0050985 A1* | 2/2008 | Roset | H01R 13/6683 |
| | | | 439/754 |
| 2009/0153143 A1 | 6/2009 | Haeffner et al. | |
| 2010/0136805 A1* | 6/2010 | Maebashi | B60R 16/0238 |
| | | | 439/76.2 |

FOREIGN PATENT DOCUMENTS

| | | |
|---|---|---|
| DE | 102008040243 A1 | 1/2010 |
| EP | 2085785 A2 | 8/2009 |
| EP | 2197075 A1 | 6/2010 |
| WO | 2009153036 A1 | 12/2009 |

\* cited by examiner

HOUSING WITH AIR CHAMBER FOR BATTERY MONITOR SYSTEM AND METHOD FOR MANUFACTURING SAME

CROSS-REFERENCE TO RELATED APPLICATIONS

This application claims the benefit of U.S. provisional application Ser. No. 61/861,592 filed Aug. 2, 2013, the disclosure of which is hereby incorporated in its entirety by reference herein.

TECHNICAL FIELD

The following relates to a housing for a battery monitor system (BMS), the housing having an air chamber formed between housing walls and a cover for the housing.

BACKGROUND

Battery monitor systems (BMS) include a housing for electrical and/or electronic components. Laser welding may be used to attach a cover to the BMS housing. Laser welding is expensive. Due to changes in environmental conditions (pressure, temperature, humidity) during product life, it is necessary to have a means to enable air equalization between the product external ambient and the ambient internal to the housing. Otherwise this might lead to damage in the electronic components inside. This is normally done letting a small gap or slot without welding between the housing and the cover.

But such a gap or slot without welding might allow water ingress and further protection means have to be added, for example forming an external wall in the cover (see, e.g., the prior art housing of FIGS. 10*a* and 10*b*). However this does not adequately prevent water ingress to the housing due to capillarity that results. As well, to enable the typical laser used in such laser welding to pass through the cover and reach the housing in order to attach the cover to the housing, the cover must be white in color, thereby requiring a paper label for the housing (instead of direct laser marking on it).

Thus, there exists a need for a housing for a BMS or other systems having an air chamber formed between the housing walls and the cover. Such a housing with an air chamber would reduce water ingress to the housing by minimizing the capillarity effect. Such a housing would also enable the use of friction surface welding (FSW) rather than laser welding to attach the cover to the housing, thereby reducing costs. Such FSW would also permit the use of a black or dark colored housing, thereby eliminating the need for a paper label as the housing may be labeled by laser marking.

SUMMARY

In at least one embodiment described herein, a housing is provided that may include a main portion comprising at least one wall defining an opening having a perimeter. The at least one wall may have a rib and an inner wall extending therefrom about the perimeter of the opening. The inner wall may have an air relief slot formed therein. The housing may further include a cover. The cover may have an edge defining a perimeter. The cover may further include a rib extending from the edge about the perimeter of the cover. The main portion rib, the inner wall, and the cover rib may be configured to cooperate for attachment of the cover to the main portion and to define an air chamber between the cover rib and the inner wall.

In another embodiment described herein, a housing is provided that may include a sidewall extending from a base and defining an opening that may have a perimeter. The sidewall may have a rib and an inner wall extending therefrom about the perimeter of the opening. The sidewall may be adapted to cooperate with a cover to define a housing chamber. The cover may have an edge defining a perimeter and a rib extending from the edge about the perimeter of the cover. The cover rib and the inner wall may define an air chamber therebetween. The air chamber may facilitate vibration of the cover relative to the inner wall to attach the cover to the inner wall by friction welding.

In a further embodiment described herein, a method for manufacturing a housing is provided. The housing may include a main portion. The main portion may include at least one wall defining an opening that may have a perimeter. The at least one wall may have a rib and an inner wall extending therefrom about the perimeter of the opening. The housing may further include a cover that may have an edge defining a perimeter. The cover may include a rib extending from the edge about the perimeter of the cover. The method may include abutting the main portion and the cover such that the inner wall of the main portion contacts an inner surface of the cover. The method may further include vibrating the cover relative to the main portion to at least partially melt the inner wall and/or the inner surface of the cover to attach the cover to the main portion. The cover rib and inner wall may define an air chamber therebetween. The air chamber may facilitate vibration of the cover relative to the inner wall to attach the cover to the inner wall by friction welding.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

With reference to the Figures, a more detailed description of embodiments of a housing 10 for electrical and/or electronic components and a method for manufacturing such a housing will be described. For ease of illustration and to facilitate understanding, like references have been used herein for like components and features throughout the drawings.

According to the embodiments set forth herein, there is generally described a housing for electrical and/or electronic components, such as may be mounted on a printed circuit board (PCB). The housing may comprise a main portion having at least one wall defining an opening, the opening having a perimeter. The perimeter of the opening formed by the at least one wall may comprise a rib, the rib having an inner wall extending therefrom, the inner wall having an air relief slot formed therein. The housing may further comprise a cover having a rib extending around a perimeter of the cover. The main portion rib and inner wall, and the cover rib are each configured to cooperate for attachment of the cover to the main portion of the housing through friction surface welding of the cover to the main portion and to form an air chamber between the main portion and the cover. A method may also be provided for manufacturing such a housing.

Figure 1:
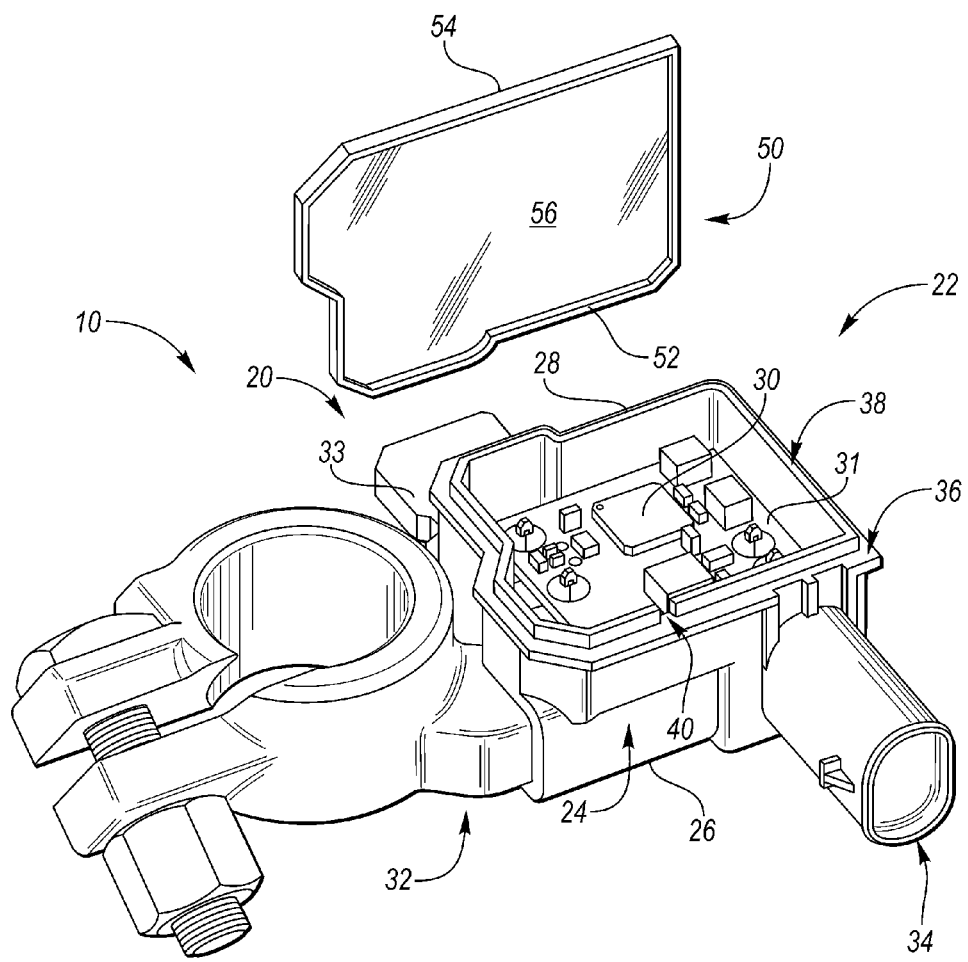
FIG. 1 is a perspective view of an exemplary housing according to embodiments described herein, such as for a battery monitor system, including a housing main portion and cover.

Referring to FIG. 1, an exemplary housing 20 is shown according to embodiments described herein, such as for a battery monitor system 10, including a housing main portion 22 and a cover 50. As seen therein, the housing 20 may comprise the main portion 22 and the cover 50. The main portion 22 may be provided with at least one wall 24 extending from a base 26. The at least one wall 24 may extend around the base 26, forming a sidewall, and define an opening 28. The opening 28 may have a perimeter.

The main portion 22 may be adapted to receive an electrical and/or electronic component and/or circuit 30 within an interior of the main portion 22 of the housing 20. The electronic component and/or circuit 30 may be mounted on and/or part of a printed circuit board (PCB) 31 disposed within the interior of the main portion 22. The electronic circuit 30 may be adapted for attachment to a battery terminal connector 32 received through the at least one wall 24. In that regard, a shunt 33 (see also, e.g., FIG. 7) may extend from the terminal connector 32 through the at least one wall 24 for connection to the electronic circuit 30. The shunt 33 may also extend though the at least one wall 24 at another location for connection to a chassis cable (not shown). The at least one wall 24 may also be formed with an opening 34 for an electrical connector (not shown) configured to connect to the PCB 31 and the electronic circuit 30.

The at least one wall 24 may have a rib 36 extending from the perimeter of the opening 28. The rib 36 may be configured as a mating surface to cooperate with a cover rib 52. The at least one wall 24 may have an inner wall 38 extending therefrom and about the perimeter of the opening 28. The inner wall 38 may have an air relief slot 40 formed therein.

The cover 50 of the housing 20 may have an edge 54 defining a perimeter of the cover 50. The cover 50 may have a rib 52 extending from the edge 54 about the perimeter of the cover 50. The rib 52 may be a complete rib around an external part of the battery monitoring system housing cover 50. The cover rib 52 may bound an inner surface 56 of the cover.

Figure 2:
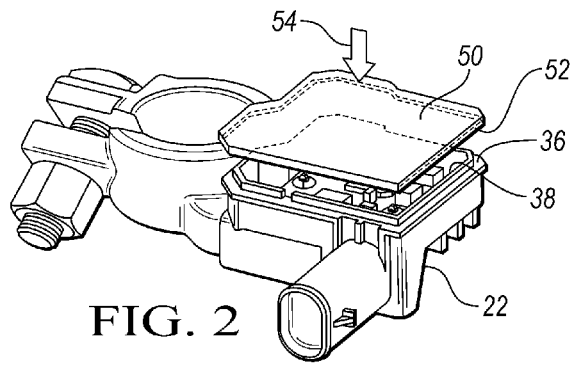
FIGS. 2-4 are perspective views of the exemplary housing of FIG. 1, with the cover shown as transparent to facilitate illustration of an exemplary friction surface welding process.
Figure 3:
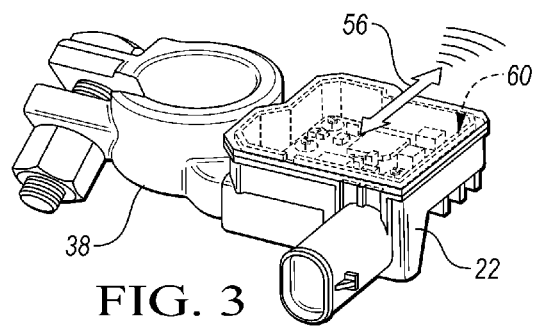
Figure 4:
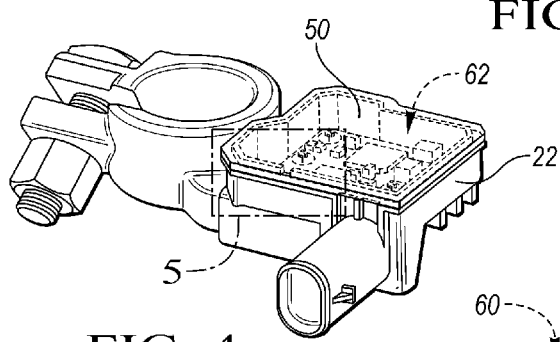
Figure 5:
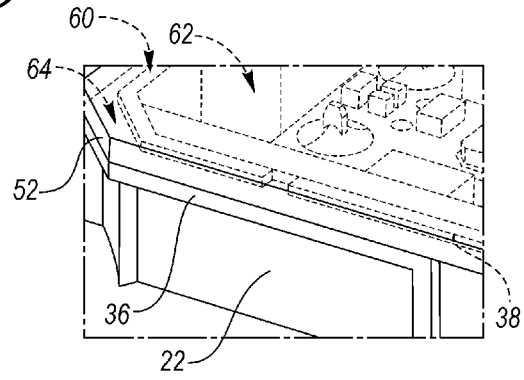
FIG. 5 is an enlarged perspective view of a portion of FIG. 4 illustrating a friction welded area.

FIGS. 2-4 depict the housing 20 of FIG. 1 with the cover 50 shown as transparent to facilitate illustration of an exemplary friction surface welding process. FIG. 5 is an enlarged view of a portion of FIG. 4 illustrating a friction welded area. The main portion rib 36, the inner wall 38, and the cover rib 52 may cooperate for attachment of the cover 50 to the main portion 22 of the housing 20. As shown in FIG. 2, the cover 50 may be placed on the main portion 22 of the housing 20. Abutting the main portion 22 and the cover 50 may align the main portion rib 36 and the cover rib 52 such that the inner wall 38 contacts the inner surface 56 of the cover 50.

As seen in FIG. 3, the engagement of the inner wall 38 with the inner surface 56 of the cover 50 may define a friction welding area 60. The cover 50 may be welded to the housing by a friction surface welding or vibration welding process. The vibrating of the cover 50 relative to the main portion 22 may heat the area 60. The frictional heating may at least partially melt the inner wall 38 and/or the inner surface 56 of the cover 50 to attach the cover 50 to the main portion 22.

As seen in FIG. 4, after the friction surface welding process, the housing 20 may be a closed unit. As a closed unit, the cover 50 may enclose the interior of the main portion 22, defining a housing chamber 62. As seen in FIG. 5, the cooperation of the main portion rib 36, the inner wall 38, and the cover rib 52 may define an air gap or air chamber 64 between the cover rib 52 and the inner wall 38. The air chamber 64 may communicate with the housing chamber 62 via the air relief slot 40.

FIG. 5 illustrates an enlarged view of a portion of the air chamber 64 and friction welded area 60 proximate the air relief slot 40. The air chamber 64 may inhibit or reduce water ingress into the housing chamber 62. As previously described, the air chamber 64 between the cover 50 and the inner wall 38 may communicate with housing chamber 62 via the air relief slot 40. The air chamber 64 may facilitate vibration of the cover 50 relative to the inner wall 38 to attach the cover 50 to the inner wall 38. In that regard, the air relief slot 40 may prevent pressure, humidity or temperature differences inside the housing chamber 62 from the outside environment that could lead to damage or undesired deformations in the product electronic circuit 30, such as which may occur during expected product working life (for example in a vehicle engine area).

Figure 6:
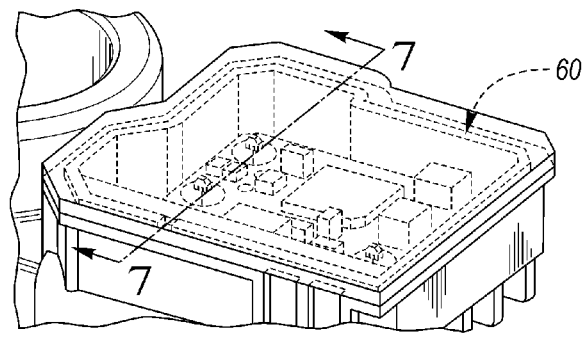
FIG. 6 is an enlarged perspective view of the exemplary housing of FIG. 1, with the cover shown as transparent to facilitate illustration of an exemplary friction surface welded area.

Referring next to FIG. 6, an enlarged perspective view is shown of the exemplary housing 20 of FIG. 1, with the cover 50 shown as transparent to facilitate illustration of an exemplary friction surface welded area 60. It should be noted that a suitable coating may be applied to the electronic circuit 30, including PCB 31, located in the housing chamber 62 to protect against humidity.

Figure 7:
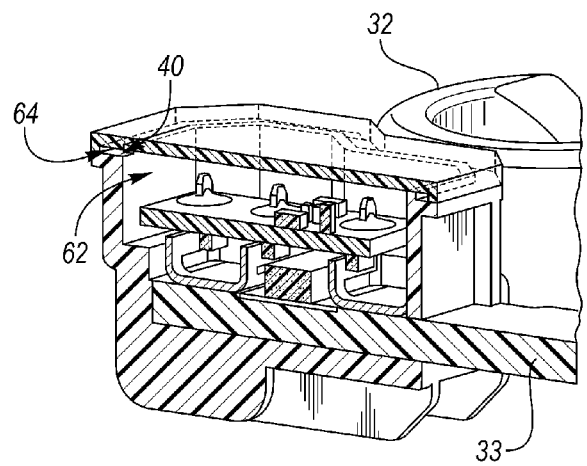
FIG. 7 is a perspective view of a cross-section of the exemplary housing of FIG. 6, taken along line 7-7 thereof.

FIG. 7 illustrates a perspective view of a cross-section of the exemplary housing of FIG. 6, taken along line 7-7 thereof. As seen therein, the air chamber 64 may extend around a perimeter of the interface between the main portion 22 and the cover 50. The air relief slot 40 enables communication between interior chamber 62 of the housing 20 and the air chamber 64 formed between the cover 50 and the inner wall 38 of the main portion 22. The housing chamber 62 may be adapted to receive the electronic circuit 30 and the PCB 31. The electronic circuit 30 may be adapted to cooperate with the battery terminal connector 32 as previously described.

Figure 8A:
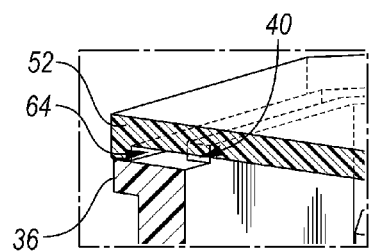
FIGS. 8*a* and 8*b* are enlarged perspective views of cross-sections of the exemplary housing of FIG. 6, taken along lines A-A and B-B thereof, respectively.
Figure 8B:
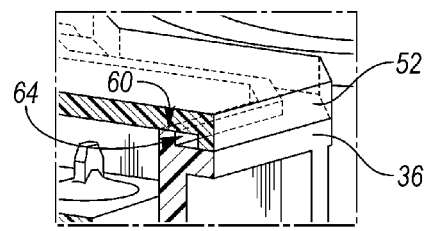

Referring next to FIGS. 8a and 8b, enlarged perspective views of cross-sections of the exemplary housing of FIG. 6 are shown, taken along lines A-A and B-B thereof, respectively. As seen therein, the main portion rib 36, the inner wall 38, and the cover rib 52 cooperate to form the air chamber 64. As previously described, the air relief slot 40 is formed in the inner wall 38.

Still referring to FIGS. 8a and 8b, the rib 36 of the main portion 22 may define a surface to cooperate with the rib 52 of the cover 50. The inner wall 38, having an air relief slot 40 formed therein, may cooperate with the inner surface 56 of the cover 50, defining the friction welded area 60. The air relief slot 40 may be sized to enable/permit some reduction of the air relief slot 40 due to partial melting of the inner wall 38 that may result from the friction surface welding process. In some embodiments an additional air relief slot may be provided.

Figure 9A:
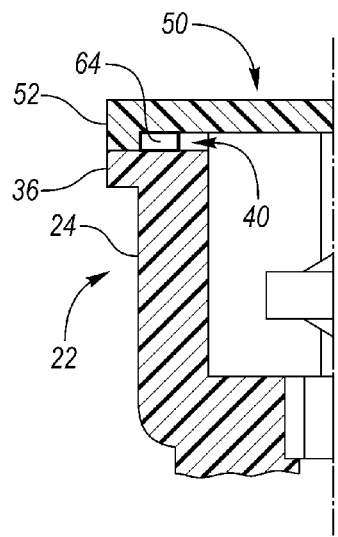
FIGS. 9*a* and 9*b* are cross-sectional views of the exemplary housing of FIG. 6, taken along lines A-A and B-B thereof, respectively.
Figure 9B:
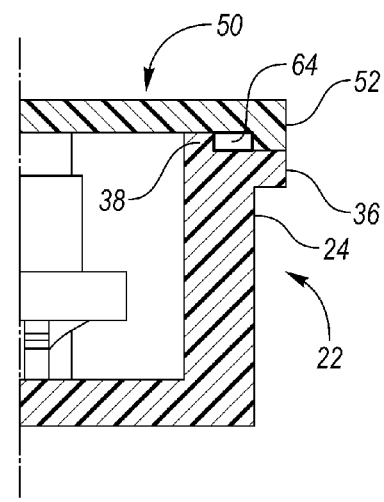

FIGS. 9a and 9b are cross-sectional views of the exemplary housing of FIG. 6, taken along lines A-A and B-B thereof, respectively. FIG. 9a illustrates the air gap or air chamber 64 proximate the air relief slot 40. As seen in those Figures, the air gap 64 is formed between the inner wall 38 and the cover rib 52. The air gap 64 is defined by the mating of the cover rib 52 with the main portion rib 36 and the engagement of the inner wall 38 with the inner surface 56, and may enable vibration of the cover 50 relative to the main portion 22. The air chamber 64 may be referred to as an intermediate chamber, and may stop or inhibit water ingress into the interior chamber 62 of the main portion 22 of the housing 20.

Figure 10A:
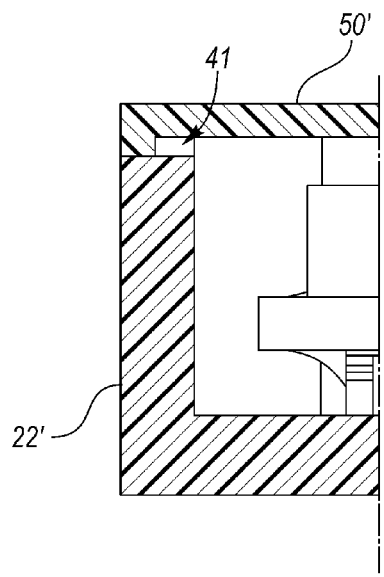
FIGS. 10*a* and 10*b* are cross-sectional views of a prior art housing and cover for a battery monitor system attached by laser welding.
Figure 10B:
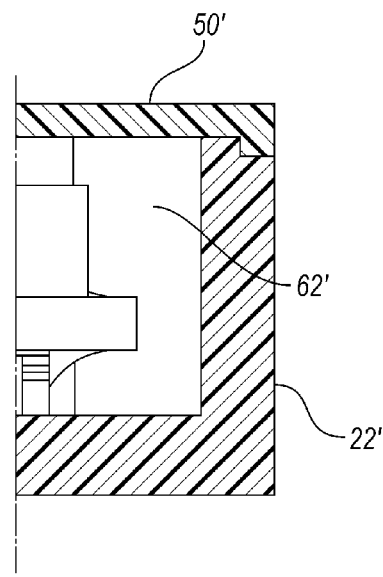

Referring next to FIGS. 10a and 10b, cross-sectional views are shown of a prior art housing 20' and cover 50', such as for a battery monitor system, attached by laser welding. With continuing reference to FIGS. 9a and 9b, FIGS. 10a and 10b illustrate the differences between the prior art attachment of the cover 50' with the main portion 22' of the housing 20' in comparison to the enhanced sealing and manufacturing features of the embodiments described herein as shown, for example, in FIGS. 9a and 9b.

As seen in FIGS. 10a and 10b, in the prior art design, the housing does not include an air gap or chamber in communication with the interior 62' of the main portion 22' via slot 41. The lack of an air gap may require welding by laser from the top through the cover 50' to attach the main portion 22'. To enable or permit laser welding, the cover 50' must have a color, such as white, that allows the laser to pass through the cover 50'. The white color may require labeling with an external adhesive paper labeling. The lack of the air gap of the prior art design may enable water ingress by capillarity and a shorter path for water intrusion into the interior of the housing 22'.

As previously described, and with reference to FIGS. 9a and 9b, the air relieve slot 40 and air gap 64 or intermediate chamber may enable the cover 50 to be attached to the main portion 22 by friction surface welding. The friction surface welding may be performed at a lower cost than attaching the cover 50' to the housing 20' by laser welding as shown in FIGS. 10a and 10b. The air gap 64 may also greatly inhibit or highly reduce water ingress into the interior 64 of the housing 20. As also previously described, the cover 50 and the main portion 22 may be made of the same material, which may be a suitable plastic material, and of the same color. The material may be of a darker color to enable labeling of the cover 50 or the main portion 22 by laser marking.

As is readily apparent from the foregoing, embodiments of a housing 20, such as for use with a battery monitoring system, have been shown and described. The housing 20 may have a cover 50 having an air chamber 64 between the housing walls 24 and the cover 50. A method for manufacturing such a housing 20 has also been shown and described. Such a housing 20 with an air chamber 64 may reduce water ingress to the housing 20. Such a housing 20 may also reduce costs through the use of friction surface welding rather than laser welding to attach the cover 50 to the housing 20, and by permitting the use of a black or dark colored cover 50, thereby permitting the cover 50 to be labeled by laser marking and eliminating the need for an adhesive paper label.

While exemplary embodiments are described above, it is not intended that these embodiments describe all possible forms of the disclosure. Rather, the words used in the specification are words of description rather than limitation, and it is understood that various changes may be made without departing from the spirit and scope of the following claims. Additionally, the features of the various embodiments shown and described herein may be combined to form further embodiments.

What is claimed is:

1. A housing comprising:
   a main portion comprising at least one wall defining an opening having a perimeter, the at least one wall having a rib and an inner wall extending therefrom about the perimeter of the opening, the inner wall having an air relief slot formed therein; and
   a cover having an edge defining a perimeter, the cover comprising a rib extending from the edge about the perimeter of the cover;
   wherein the main portion rib, the inner wall and the cover rib are configured to cooperate for attachment of the cover to the main portion and to define an air chamber between the cover rib and the inner wall.

2. The housing of claim 1 wherein the main portion is adapted to receive an electronic component, the component configured for attachment to a battery terminal connector.

3. The housing of claim 1 wherein the air chamber facilitates vibration of the cover relative to the main portion to attach the cover to the main portion by friction welding.

4. The housing of claim 3 wherein the inner wall is configured to engage an inner surface of the cover to define a friction welding area.

5. The housing of claim 1 wherein the air chamber communicates with an interior of the housing via the air relief slot.

6. The housing of claim 1 wherein the air chamber inhibits water ingress into the housing.

7. The housing of claim 1 wherein the main portion and the cover comprise the same plastic material.

8. A housing comprising:
   a sidewall extending from a base and defining an opening having a perimeter, the sidewall having a rib and an inner wall extending therefrom about the perimeter of the opening;
   wherein the sidewall is adapted to cooperate with a cover to define a housing chamber, the cover having an edge defining a perimeter and comprising a rib extending from the edge about the perimeter of the cover, wherein the cover rib and inner wall define an air chamber therebetween, and wherein the air chamber facilitates vibration of the cover relative to the inner wall to attach the cover to the inner wall by friction welding.

9. The housing of claim 8 further comprising a cover adapted to cooperate with the sidewall for attachment of the cover to the sidewall to define the housing chamber.

10. The housing of claim 8 wherein the air chamber communicates with the housing chamber via an air relief slot formed in the inner wall.

11. The housing of claim 8 wherein the inner wall is configured to engage an inner surface of the cover to define a friction welding area.

12. The housing of claim 8 wherein the sidewall and base are adapted to receive an electronic component, the component configured for attachment to a battery terminal connector.

13. The housing of claim 8 wherein the air chamber inhibits water ingress into the housing chamber.

14. The housing of claim 9 wherein the sidewall and the cover comprise the same plastic material.

\* \* \* \* \*